(12) United States Patent
Madan

(10) Patent No.: US 7,733,682 B2
(45) Date of Patent: Jun. 8, 2010

(54) PLATELINE DRIVER FOR A FERROELECTRIC MEMORY

(75) Inventor: Sudhir K. Madan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 153 days.

(21) Appl. No.: 11/955,861

(22) Filed: Dec. 13, 2007

(65) Prior Publication Data
US 2009/0154220 A1   Jun. 18, 2009

(51) Int. Cl.
*G11C 11/22* (2006.01)
(52) U.S. Cl. ................. 365/145; 365/109; 365/117; 365/86; 365/149
(58) Field of Classification Search .......... 365/145, 365/109, 117, 86, 149
See application file for complete search history.

(56) References Cited

U.S. PATENT DOCUMENTS

2001/0036100 A1 * 11/2001 Esterl et al. ............. 365/145
2004/0047172 A1 *  3/2004 Komatsuzaki ............ 365/145
2005/0195628 A1 *  9/2005 Takahashi et al. ........ 365/49

* cited by examiner

*Primary Examiner*—Thong Q Le
(74) *Attorney, Agent, or Firm*—Rose Alyssa Keagy; W. James Brady; Frederick J. Telecky, Jr.

(57) ABSTRACT

One embodiment relates to a ferroelectric memory device. The ferroelectric memory device includes a memory array comprising one or more ferroelectric memory cells that are arranged in a number of plateline groups. The memory device also includes a plateline driver configured to boost a plateline voltage above a supply voltage within the plateline driver, and provide the boosted plateline voltage along platelines associated with the plateline driver. Other methods and systems are also disclosed.

20 Claims, 9 Drawing Sheets

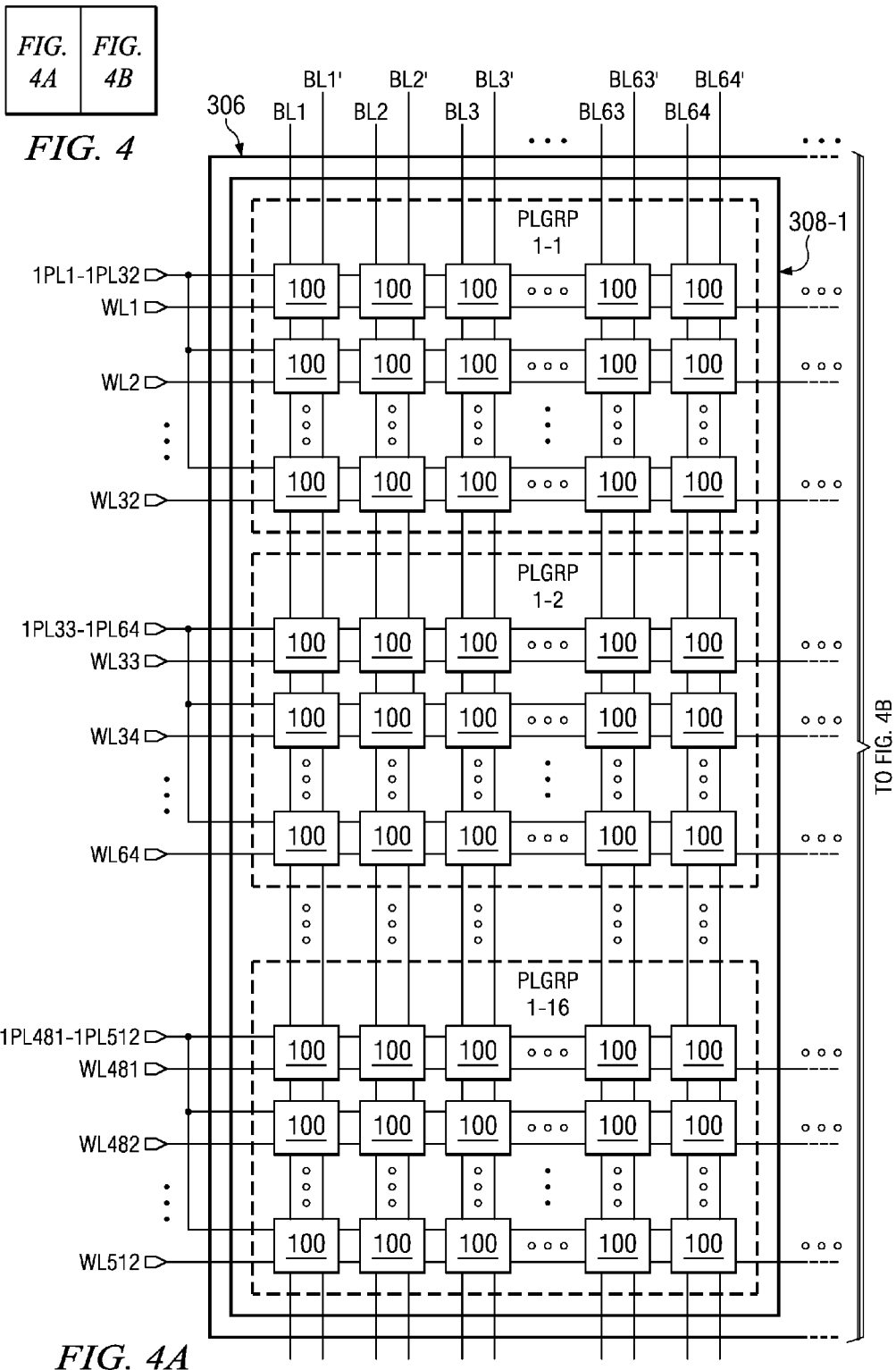

PLATELINE DRIVER FOR A FERROELECTRIC MEMORY

FIELD OF INVENTION

The present invention relates generally to semiconductor memory devices and more particularly to improved methods and systems for ferroelectric memory devices.

BACKGROUND OF THE INVENTION

Semiconductor memory devices store data and/or program code in personal computer systems, embedded processor-based systems, video image processing circuits, communications devices, and the like. A ferroelectric memory device is one type of semiconductor memory device.

Ferroelectric memory devices provide non-volatile data storage by employing ferroelectric capacitors that are constructed using ferroelectric dielectric material that may be polarized in one direction or another in order to store a binary value. The ferroelectric effect allows for the retention of a stable polarization in the absence of an applied electric field due to the alignment of internal dipoles within perovskite crystals in the ferroelectric material. This alignment may be selectively achieved by application of an electric field in a first direction that exceeds a coercive field of the material. Conversely, reversal of the applied field reverses the internal dipoles, wherein the response of the polarization of a ferroelectric capacitor to the applied voltage may be plotted as a hysteresis curve.

Given the technological complexity of ferroelectric memory devices, these products require significant capital expenditures to be developed and successfully delivered to the marketplace. Thus, developers rely on strong intellectual property rights in this arena to allow them to rationalize and protect the huge capital expenses involved.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

One embodiment relates to a ferroelectric memory device. The ferroelectric memory device includes a memory array made up of one or more ferroelectric memory cells that are arranged in a number of plateline groups. A plateline driver is configured to boost a plateline voltage above a supply voltage therein, and provide the boosted plateline voltage along platelines associated with a predetermined plateline group.

The following description and annexed drawings set forth in detail certain illustrative aspects and implementations of the invention. These are indicative of only a few of the various ways in which the principles of the invention may be employed.

BRIEF DESCRIPTION OF THE DRAWINGS

FIG. 4A-4B is a schematic diagram illustrating an exemplary section of a ferroelectric memory device in accordance with some aspects of the invention;

DETAILED DESCRIPTION OF THE INVENTION

Figure 1:
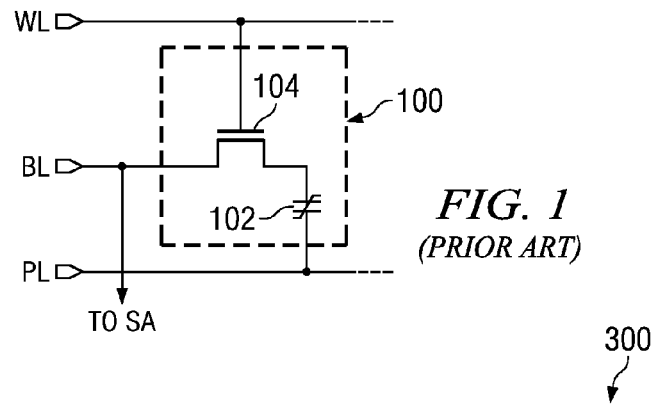
FIG. 1 is a schematic diagram illustrating a 1T1C cell.

One or more implementations of the present invention will now be described with reference to the attached drawings, wherein like reference numerals are used to refer to like elements throughout. Although some embodiments of the invention are described below with reference to a four megabyte (4 M) ferroelectric memory device, it will be appreciated that the invention could extend to any ferroelectric memory device, regardless of size. For example, a ferroelectric memory device could be much smaller (e.g., a single ferroelectric memory cell) or could be much larger (e.g., many gigabytes or terabytes), where all such variations are contemplated as falling within the scope of the invention. Further, to the extent that a memory array as discussed herein is subdivided into sections, segments, plateline groups, and the like, it will be appreciated that the size of these subdivisions could also vary depending on design constraints.

Ferroelectric memories in accordance with the invention can be organized in single-transistor, single-capacitor (1T1C) or two-transistor, two-capacitor (2T2C) configurations. FIG. 1 illustrates an exemplary 1T1C ferroelectric memory cell 100 that includes a single ferroelectric capacitor 102 and an access transistor 104. The access transistor 104 serves to connect the cell capacitor 102 between a bitline BL and a plateline PL.

Figure 2:
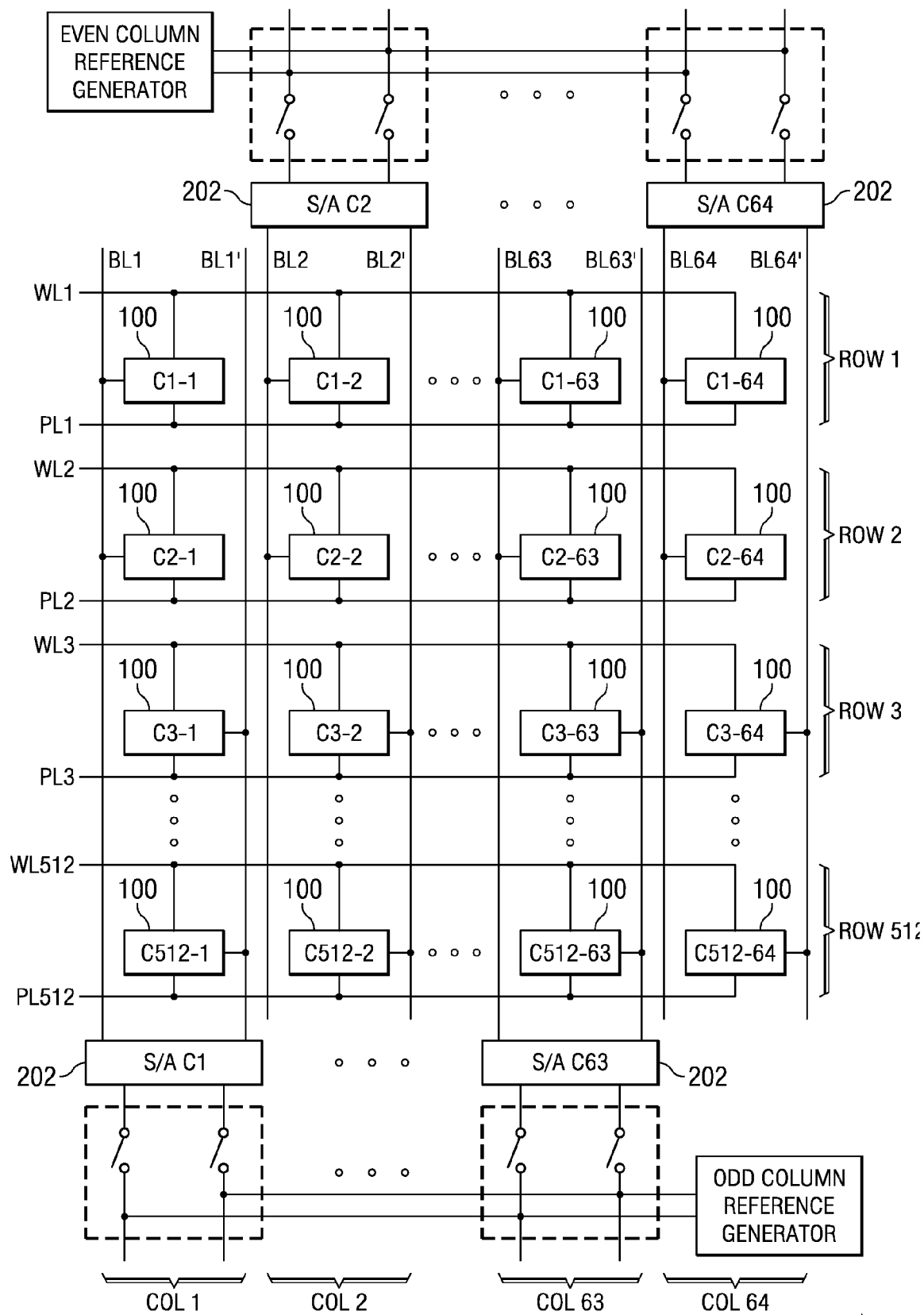
FIG. 2 is a schematic diagram illustrating a 1T1C folded bitline ferroelectric memory device.

FIG. 2 illustrates a 32 kilobyte (32K) ferroelectric memory device 200 that includes a number of ferroelectric memory cells 100 organized in a folded bitline architecture. The memory cells 100 are arranged in 512 rows (words) and 64 columns (bits) indicated as $C_{ROW\text{-}COLUMN}$, where each column of memory cells is accessed via a pair of complementary bitlines $BL_{COLUMN}$ and $BL_{COLUMN}'$. In Row 1 of the memory device 200, for example, the cells $C_{1-1}$ through $C_{1-64}$ form a 64 bit data word accessible via complementary bitline pairs BL1/BL1' through BL64/BL64' by activation of a wordline WL1. The cell data is sensed during data read operations using sense amp circuits 202 (S/A C1 through S/A C64) associated with columns 1 through 64, respectively.

During a typical write operation to Row 1 (i.e., memory cells $C_{1-1}$ through $C_{1-64}$), a voltage $V_{wl}$ is applied to a wordline WL1, wherein the $V_{wl}$ is typically greater than or equal to a supply voltage $V_{DD}$ plus a threshold voltage of the access transistors, thereby turning on the access transistors within Row 1 and coupling the bitlines BL1-BL64 to the ferroelectric capacitors in the accessed cells. Suitable voltages are then applied to the bitlines BL1-BL64, where the voltage on each bitline is representative of a data value to be written to the memory cell attached to that bitline. While the wordline WL1 and bitlines are properly biased, the plateline PL1 is pulsed high, polarizing the ferroelectric dielectric material in one direction or another, and thereby storing one of at least two data states in each of the accessed memory cells.

During a typical read operation of Row 1, voltage $V_{wl}$ is again applied to wordline WL1 to turn on the access transistors and couple the bitlines BL1-BL64 to the ferroelectric capacitors of the accessed cells. The plateline PL1 is then pulsed high, causing the ferroelectric capacitors to discharge charge through the access transistors to the bitlines BL1-BL64, thereby causing the bitline voltages BL1-BL64 to rise. The amount by which the bitline voltages rise depends upon the state of the ferroelectric capacitors being accessed. To determine whether the state of the ferroelectric capacitors being accessed is a "1" or a "0", one differential input terminal of the sense amps is coupled to the cell bitline (e.g., data bitline BL1) and the other differential sense amp input is coupled to a reference voltage (e.g., reference bitline BL1' in this example). Depending upon whether the cell bitline BL1 is high or low relative to the reference voltage BL1', the sense amp returns a "1" or a "0".

As the inventors have appreciated, however, if the plateline voltage is not sufficiently high for read and or write operations, the voltage across the ferroelectric capacitors may be insufficient to put those capacitors into the saturation region of the hysterisis curve for optimum sense signal margins. An insufficient plateline voltage may cause the memory cell to have insufficient read margin and may cause the memory cells to provide unreliable read data values. During read (cell interrogation) the voltage across the ferro-electric capacitors is reduced from the plateline voltage by the voltage that develops on the bitlines which may be, for example, in the range of 200-600 mV. Thus, it is advantageous to "boost" the plateline voltage so it is greater than a supply voltage (e.g., VDD) associated with a plateline driver that provides the plateline voltage.

Figure 3:
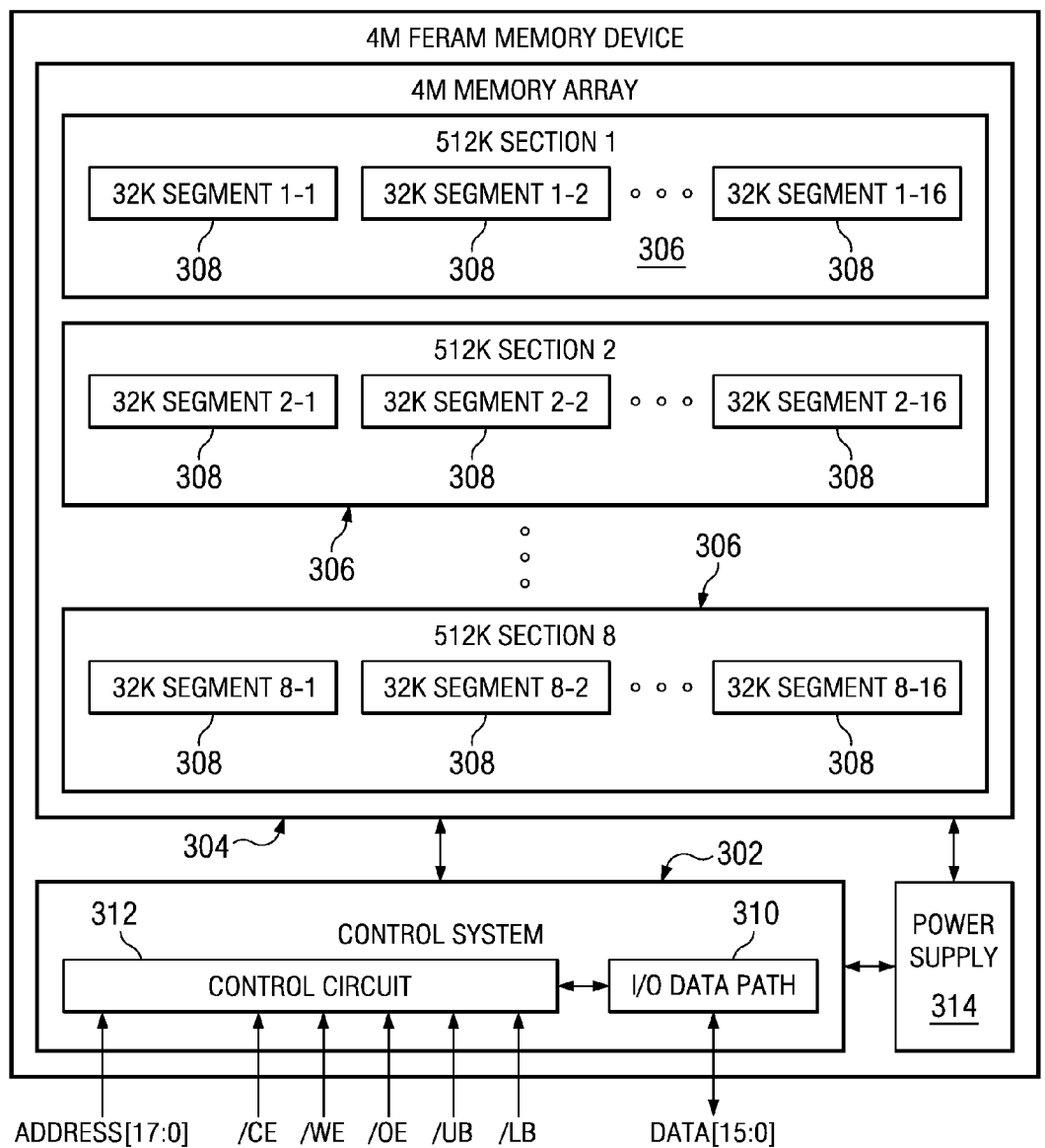
FIG. 3 is a schematic diagram illustrating an exemplary ferroelectric memory device in accordance with some aspects of the invention.

To remedy these and other shortcomings, the inventors have fashioned advantageous ferroelectric memory devices. As shown in FIG. 3, one embodiment of such a ferroelectric memory device is a 4M ferroelectric memory device 300 that includes a control system 302 and memory array 304.

The memory array 304 includes at least 2^22 ferroelectric memory cells (i.e., four megabits), and often some non-active dummy or edge memory cells in addition thereto, that are arranged in eight 512K memory sections 306, where each memory section 306 is subdivided into sixteen segments 308 of 32K each. For example, in the lower right-hand corner of the array 304, one can see the sixteenth segment within the eighth section labeled as "32K Segment 8-16." The non-active edge cells may or may not have all components or layers of the active memory cells.

The control system 302 is coupled to the memory array 304 and provides suitable biasing voltages to write and read data to and from individual ferroelectric memory cells. More specifically, the control system 302 includes an I/O data path 310 and a control circuit 312, where the control circuit 312 generates wordline, bitline, and plateline signals according to decoded address information and/or signals for read, restore, and write operations (e.g., chip enable (CE), write enable (WE), output enable (OE), upper byte enable (UB), lower byte enable (LB), address [17:0], and data[15:0]). The memory device may also include a power supply 314 for providing a supply voltage, $V_{DD}$. In various embodiments, the power supply may be on-chip (e.g., a band-gap reference circuit); while in other embodiments the power supply could be off-chip and supplied to the memory device via I/O pins. If the power supply is off-chip, it will be appreciated that the I/O pin itself or some other component in the memory device could constitute the power supply.

Figure 4B:
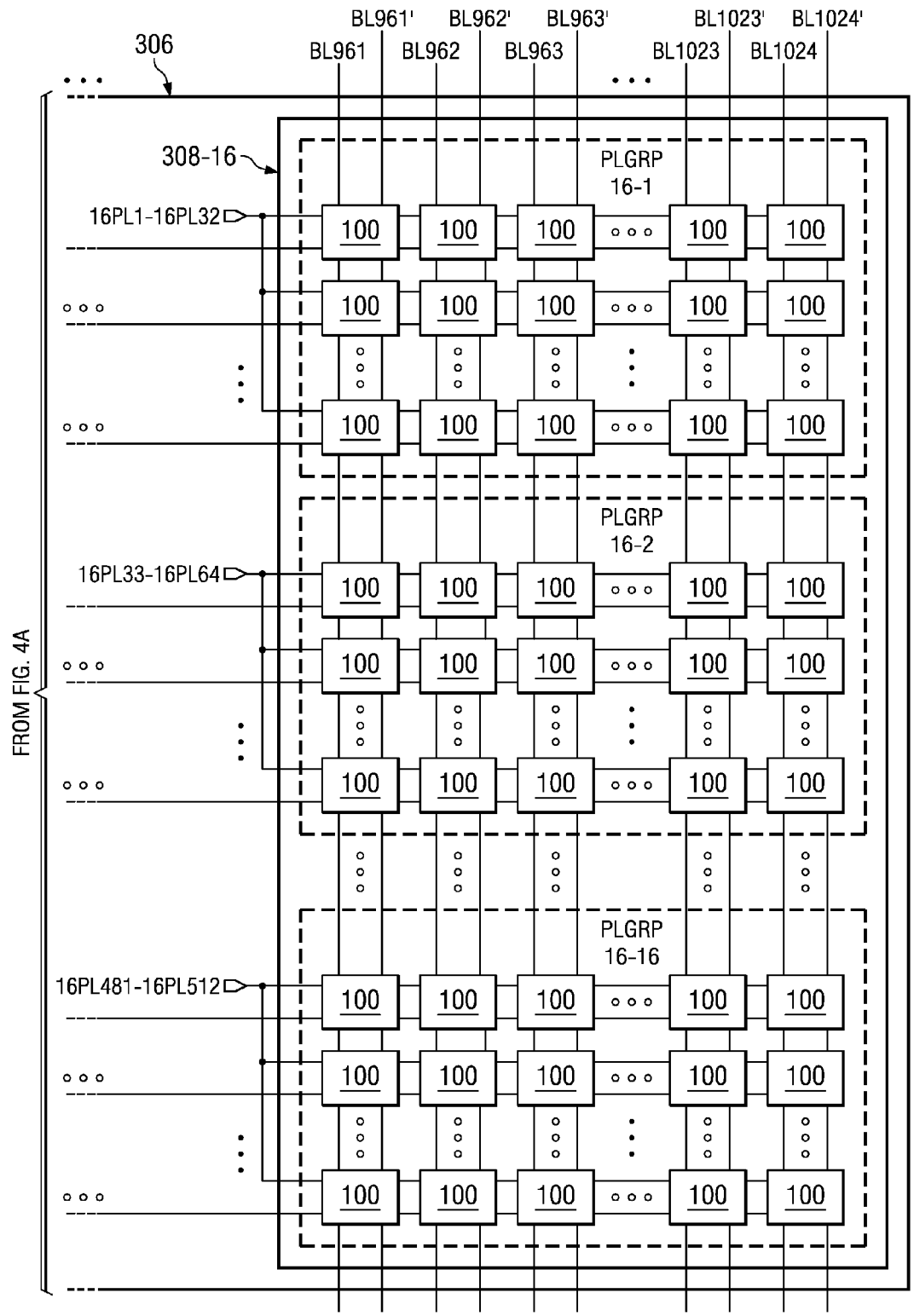

FIG. 4A-4B shows a section 306 of the memory array 304 in more detail. For purposes of convenience and clarity, the illustrated section 306 could be thought of as corresponding to "512K Section 1" of FIG. 3, although the illustration could also be applicable to other sections as well. As shown, memory cells 100 within the section 306 are arranged in sixteen segments (308-1, . . . , 308-16). Within each segment (e.g., 308-1), the memory cells 100 are partitioned into sixteen plate groups (e.g., PLGRP 1-1; PLGRP 1-2; . . . ; PLGRP 1-16), wherein each plate group includes 32 rows of memory cells and has a common plate line driver coupled to all the platelines in the plate group. In the exemplary section 306, the wordlines WL extend across (e.g., are shared among) multiple segments within the section 306. The bitlines BL for the section 306 extend vertically across multiple plate groups within the section, and could extend vertically across multiple sections depending on the implementation.

Figure 5:
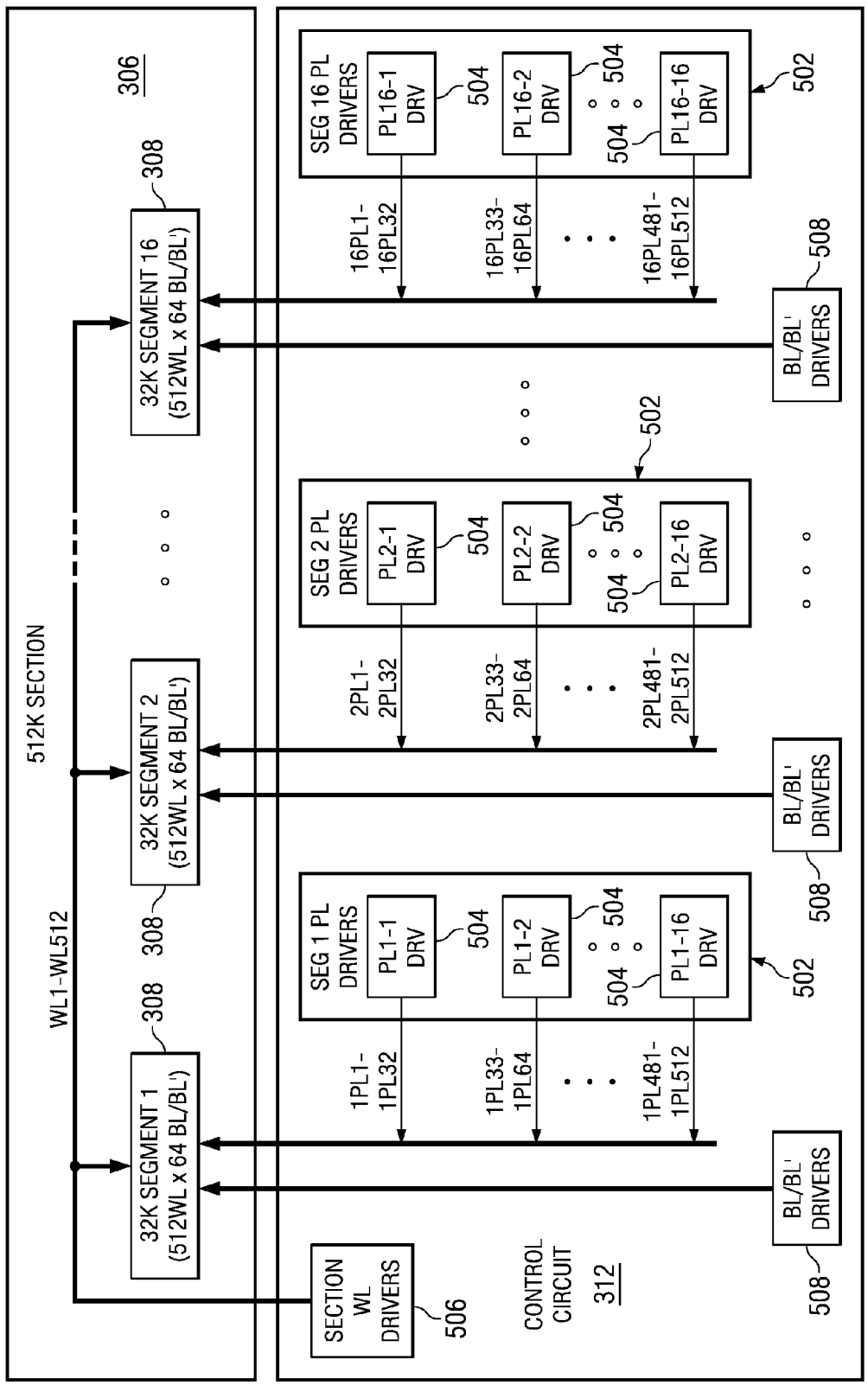
FIG. 5 is a schematic diagram illustrating one embodiment of how plateline drivers in a control circuit can be coupled to a section of an exemplary a ferroelectric memory device in accordance with some aspects of the invention.

Referring now to FIG. 5, one can see some details of the control circuit 312, and in particular how plate line drivers, word line drivers, and bit line drivers are associated with a section 306 of the memory array 304. As FIG. 5 shows, a set of plateline drivers 502 is associated with each segment 308. Further, within each set of plateline drivers 502, an individual plateline driver 504 provides a plateline voltage signal to an individual plategroup within a predetermined segment 308. For example, segment "32K Segment 1" is associated with the set of plateline drivers "SEG 1 PL DRIVERS", which consists of sixteen individual plateline drivers "PL1-1 DRV, PL 1-2 DRV, . . . , PL1-16 DRV". By briefly cross-referencing FIG. 4A-4B, one can see that plateline driver PL1-1 DRV provides a plateline voltage signal along path 1PL1-1PL32 to the plategroup associated with WL1-WL32 of Segment 1. The other plateline drivers are similarly associated with individual plategroups. Wordline drivers 506 and bitline drivers 508 may be included as well. In the preferred embodiment each plategroup is associated with a plural number of wordlines (32 in the example). However, the invention is equally applicable when a plategroup is associated with only one wordline and in that case the word a "plategroup" would mean a "plateline". Typically, within a set of plateline drivers 502 only one individual plateline driver 504 is asserted at a time. This may facilitate reduced power consumption.

However, in some control circuits more than one individual plateline driver may be asserted simultaneously.

Figure 6:
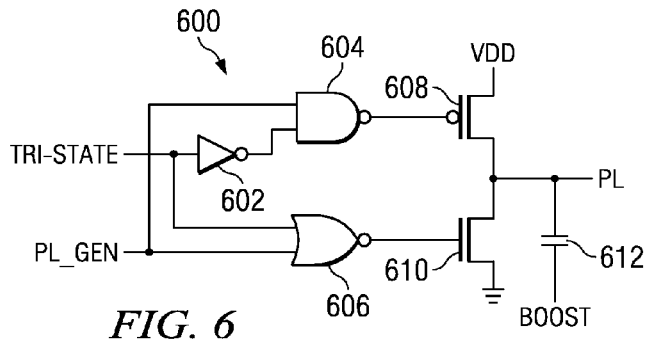
FIG. 6 is a schematic diagram illustrating one embodiment of a plateline driver in accordance with some aspects of the invention.

Referring now to FIG. 6, one can see one embodiment of an individual plateline driver 600 that boosts a supply voltage, $V_{DD}$, up to a boosted plateline voltage. The plateline driver 600 includes an inverter 602, a NAND gate 604, a NOR gate 606, a PMOS drive transistor 608, an NMOS drive transistor 610, and a capacitor 612.

During operation, a Tri-state signal (TRISTATE), a plate line voltage generation signal (PLGEN), and a Boost signal (BOOST) are selectively applied to produce a boosted plateline voltage along the plateline PL. The PMOS drive transistor 608 and NMOS drive transistor 610 work in complementary fashion to supply an initial plateline voltage of slightly less than VDD along the plateline PL when PLGEN is asserted. More specifically, this initial plateline voltage will be equal to VDD minus a slight voltage drop across PMOS drive transistor 608. While the initial plateline voltage is on plateline PL, first TRISTATE and then BOOST can be asserted, thereby causing the capacitor 612 to discharge additional charge onto the plateline PL and providing the boosted plateline voltage.

Figure 7:
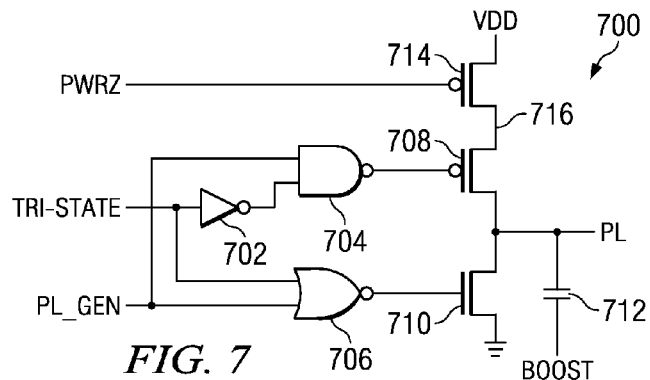
FIG. 7 is a schematic diagram illustrating another embodiment of a plateline driver in accordance with some aspects of the invention.

FIG. 7 shows another embodiment 700 that is somewhat similar to FIG. 6's embodiment, except that an additional PMOS transistor has also been added. Thus, individual plateline driver 700 includes an inverter 702, a NAND gate 704, a NOR gate 706, a PMOS drive transistor 708, an NMOS drive transistor 710, a capacitor 712, and a PMOS transistor 714 that shares an internal node 716 with the PMOS drive transistor 708.

During operation, when the PWRZ signal goes low, the internal node 716 may develop an initial voltage that is slightly less than VDD. The PLGEN signal may first be asserted, after which the TRISTATE signal may be asserted to develop an initial plateline voltage on the plateline. While the initial plateline voltage is present on the plateline, the BOOST signal may be asserted to provide a boosted plateline signal. More detailed functionality will be described further herein with reference to FIGS. 8-9.

Still referring to FIG. 7, in some embodiments, the PMOS transistor 714 may be shared between the individual plateline drivers 504 within a set of plateline drivers 502. In typical embodiments, this PMOS transistor 714 has a longer gate length than that for the drive transistors 708 and 710 which have the minimum gate length allowed by the design rules. For example, in one embodiment PMOS transistor 714 could have a gate length of about 0.20 um, while PMOS drive transistor 708 could have a gate length of approximately 0.15 um and NMOS drive transistor 710 could have a gate length of approximately 0.15 um. Longer gate length for the transistor 714 is expected to reduce the standby leakage current for the driver circuit since typically longer gate length results in lower leakage.

Figure 8:
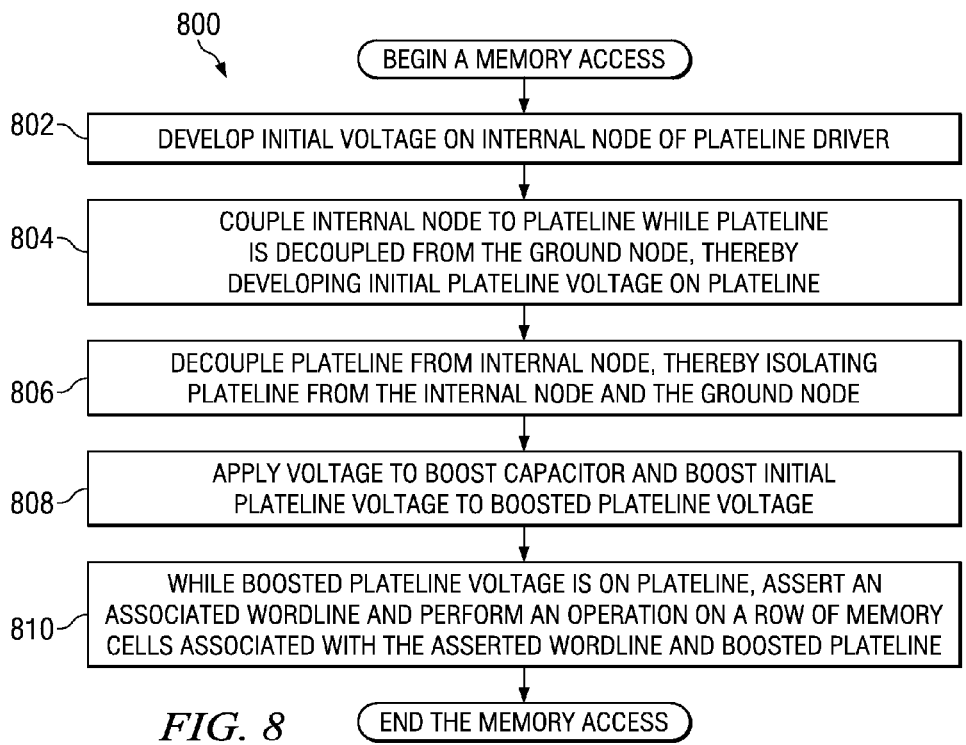
FIG. 8 is a flow diagram illustrating a method of accessing a memory cell using a boosted plateline voltage.
Figure 9:
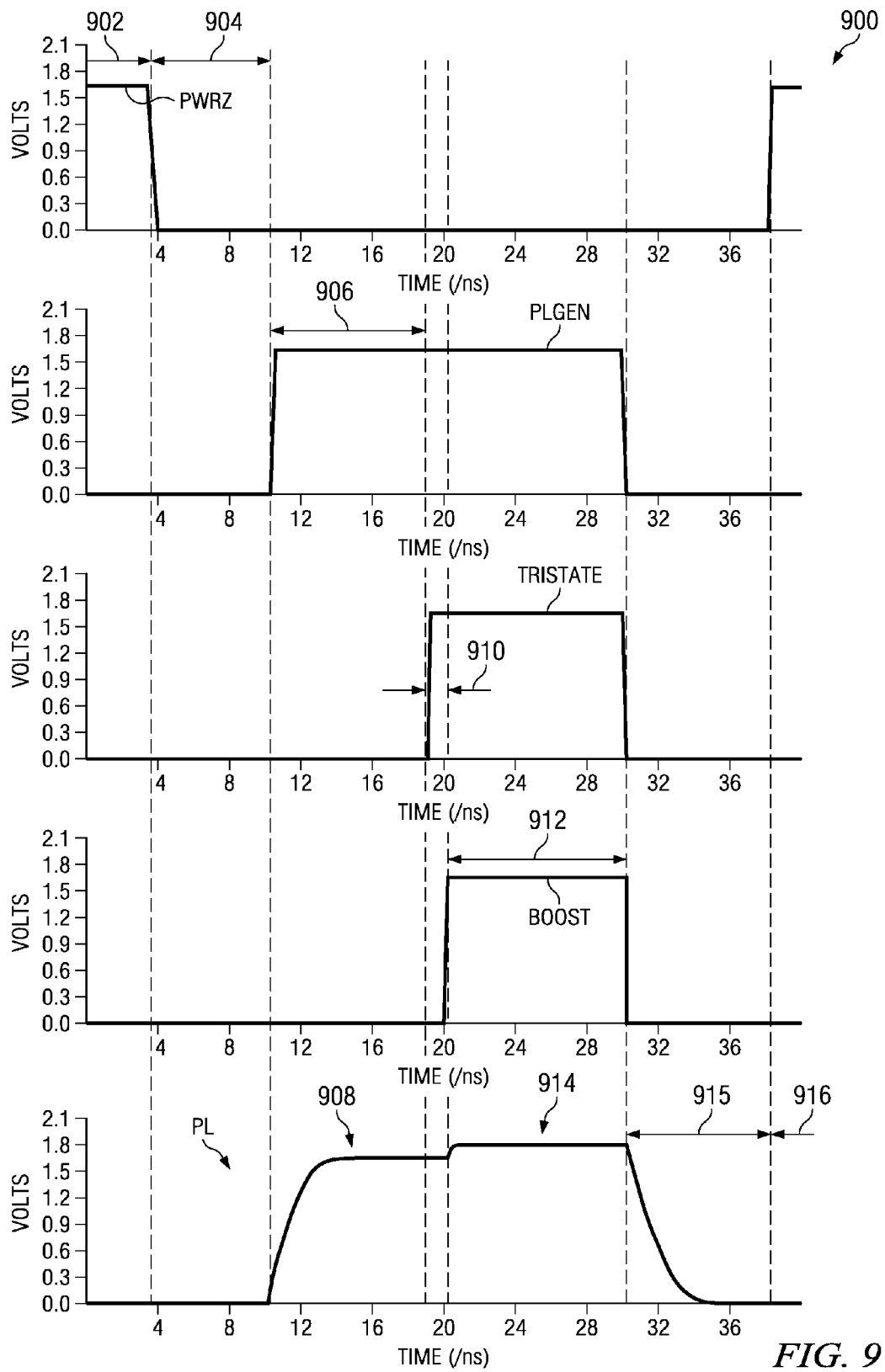
FIG. 9 is a group of waveforms illustrating a method of accessing a memory cell using a boosted plateline voltage consistent with FIG. 7's embodiment.

To further appreciate the functionality of FIG. 7's individual plateline driver 700, FIG. 8 shows a somewhat general method of operation 800 and FIG. 9 shows a more detailed method of operation as a series of waveforms 900. While these methods 800, 900 as well as other methods herein are illustrated and described as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. Some or all acts may repeat during an access. In addition, not all illustrated steps may be required to implement a methodology in accordance with the present invention.

As shown in FIG. 8, the somewhat general method 800 begins at 802 when an initial voltage is developed on the internal node 716 of the plateline driver 700. At 804, the internal node 716 is coupled to the plateline PL, thereby developing an initial plateline voltage on the plateline PL. In 806, the plateline PL is decoupled from the internal node 716, thereby electrically isolating the plateline PL from the internal node and ground. In 808, a voltage is applied to the capacitor 712, thereby boosting the initial plateline voltage to a boosted plateline voltage. In 810, while the boosted plateline voltage is on the platelines, a wordline associated with boosted plateline is asserted to access a row of memory cells and an operation is performed on a row of memory cells associated with the asserted wordline and the boosted plateline (e.g., suitable bitline voltages could be applied to the accessed cells). In some embodiments, the wordline could be asserted before the initial plateline voltage or boosted plateline voltage is developed.

Referring now to FIG. 9, one can see more detailed waveforms 900 that are discussed in the context of FIG. 7's plateline driver 700. These waveforms, which were developed on a simulation tool, represent only one embodiment of the invention, and other embodiments are also contemplated as falling within the scope of the invention. For example, in other embodiments, the waveforms may vary as a function of many variables, such as the capacitance value of the capacitor 712, the plateline load capacitance (not shown) that plateline is driving, the lengths and widths of the transistors, etc.

During time 902, PWRZ is high, causing the PMOS transistor 714 to be off. Therefore, no conductive channel exists in the PMOS transistor 714, and the plateline PL is decoupled from the supply voltage, VDD, which is approximately 1.65 Volts (V) in this embodiment. Because TRISTATE and PLGEN are both low at this time, a high voltage is asserted on the gate of the NMOS drive transistor 710, coupling in the plateline PL to ground, VSS, which is approximately 0V in this embodiment.

During time 904, PWRZ has transitioned to a low-voltage, thereby applying a low-voltage to the gate of PMOS transistor 714 and creating a conductive channel therein. Thus, an initial voltage is developed on the internal node 716, where the initial voltage is equal to VDD minus a voltage drop over the PMOS transistor 714.

During time 906, PLGEN has transitioned to a high voltage. This high voltage turns PMOS drive transistor 708 on, thereby allowing the initial voltage be coupled from the internal node 716 to the plateline PL and establishing an initial plateline voltage 908 on the plateline PL. This initial plateline voltage 908 is approximately equal to the VDD minus a small voltage drop over the PMOS drive transistor 708 and transistor 714. The initial plateline voltage 908 also causes charge to be stored in the capacitor 712 during this time 906 when the BOOST node is at 0V.

During time 910, TRISTATE has transitioned to a high-voltage, turning off both the PMOS drive transistor 708 and NMOS drive transistor 710. Thus, the drivers for plateline PL are in a so-called tri-state, or high impedance state, where the charge and the initial plateline voltage developed on the plateline PL and capacitor 712 tends to stay constant, notwithstanding any leakage that may occur.

During time 912, BOOST is driven to a high voltage, causing the capacitor 712 to "dump" charge onto the plateline PL and boosting the initial plateline voltage 908 to a boosted plateline voltage 914. As previously mentioned, this boosted plateline voltage 914 may place a larger voltage than VDD across the ferroelectric capacitor 102, so as to put the ferroelectric capacitor 102 into the saturation region (or nearer to the saturation region than possible with VDD) of the hysteresis curve. Further, because the boosted plateline voltage 914 may be applied to an individual plategroup at a given time rather than raising the power supply for all plateline drivers for an entire segment, the present disclosure may provide lower power consumption for the memory device than previously achievable.

Also during time 912, while the boosted plateline voltage 914 is on the platelines, a wordline could be asserted to access a row of memory cells and suitable operation associated with read and or write is performed on the row of cells with boosted plateline. In some embodiments, the wordline could be asserted before the initial or boosted plateline voltage is developed.

In the illustrated embodiment, the boosted plateline voltage 914 is approximately 10% higher than the initial plateline voltage 908 and supply voltage, VDD. In other embodiments, the boosted plateline voltage 914 could be up to Vtp (threshold voltage of the p-ch transistor 708 in FIG. 7 or transistor 608 in FIG. 6) higher than the supply voltage, where all such boosted plateline voltages are contemplated as falling within the scope of the invention. Typically the Vtp range between 0.3V to 0.5V.

After PLGEN, TRISTATE and BOOST have been taken low during time 915, PWRZ is again taken high during time 916 to decouple the supply voltage VDD from the plateline PL. Thus, leakage and excess power dissipation can be limited between memory accesses if desired. Further, in other embodiments, BOOST need not be asserted each time a plateline is activated.

Figure 10:
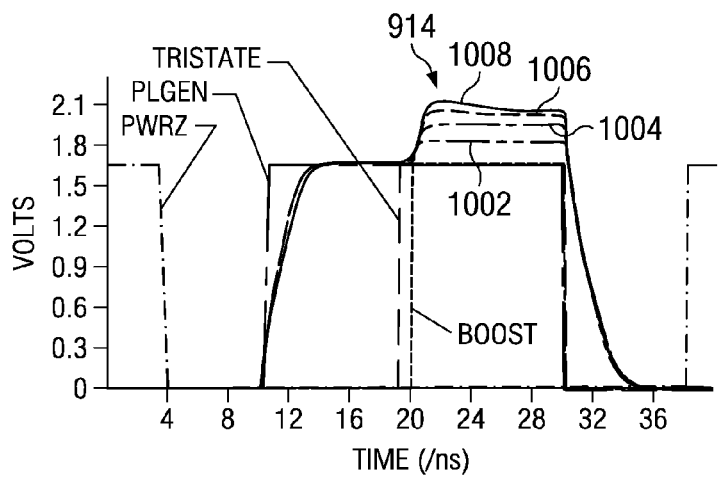
FIG. 10 is another group of waveforms illustrating a method of accessing a memory cell using a boosted plateline voltage consistent with FIG. 7's embodiment.

Referring briefly to FIG. 10, one can see the previously described signals superimposed on a single set of axes. This figure also shows several examples of how the boosted plateline voltage 914 could vary as a function of the capacitance value of capacitor 712. In this embodiment, the capacitor 712 could comprise several "dummy or edge" ferroelectric capacitors from non-active cells, which could be extra ferroelectric capacitors formed around the array for various reasons. They include optical proximity correction, etch uniformity, stress modulation, etc. These edge or dummy capacitors are typically the same size as the cell capacitors. As the capacitance increases, the boosted plateline voltage 914 tends to rise. For example curve 1002 illustrates an example where the capacitor 712 has a capacitance equal to 4 ferroelectric capacitors. In curve 1004, the capacitor 712 has a capacitance equal to 8 ferroelectric capacitors. In curve 1006, the capacitor 712 has a capacitance equal to 12 ferroelectric capacitors; and in curve 1008, the capacitor 712 has a capacitance equal to 16 ferroelectric capacitors. In this example each plate line is coupled to ferroelectric capacitors from 18 columns. The capacitor 712 could also be a standalone MOS capacitor or a ferroelectric capacitor having size different from the cell capacitor.

Notably, the boosted plateline voltage of curve 1008 tends to dynamically fall after the initial boost when the boosted plateline voltage exceeds the supply voltage plus a Vtp (threshold voltage) of the PMOS transistor. At this voltage, the charge "dumped" onto the plateline by the capacitor leaks back across the PMOS transistor, which now has the necessary $V_{DS}$ and $V_{GS}$ to conduct.

Figure 11:
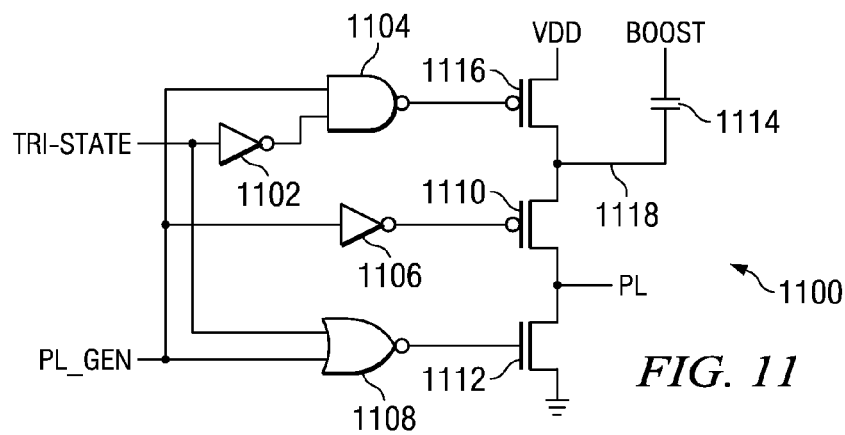
FIG. 11 is a schematic diagram illustrating another embodiment of a plateline driver in accordance with some aspects of the invention.

Referring now to FIG. 11, one can see still another embodiment of an individual plateline driver 1100 that boosts a supply voltage, VDD, up to a boosted plateline voltage. The plateline driver 1100 includes a first inverter 1102, a NAND gate 1104, a second inverter 1106, a NOR gate 1108, a PMOS drive transistor 1110, an NMOS drive transistor 1112, a capacitor 1114, and a PMOS transistor 1116 that shares an internal node 1118 with the PMOS drive transistor 1110.

During operation, a plate line voltage generation signal (PLGEN), a Tristate signal (TRISTATE), and a Boost signal (BOOST) are selectively applied to produce a boosted plateline voltage along the plateline PL. In short, the signals work in conjunction with one another to develop an initial plateline voltage on the plateline PL. After the initial plateline voltage is established, TRISTATE followed by BOOST are asserted to boost the initial plateline voltage on the plateline PL.

Figure 12:
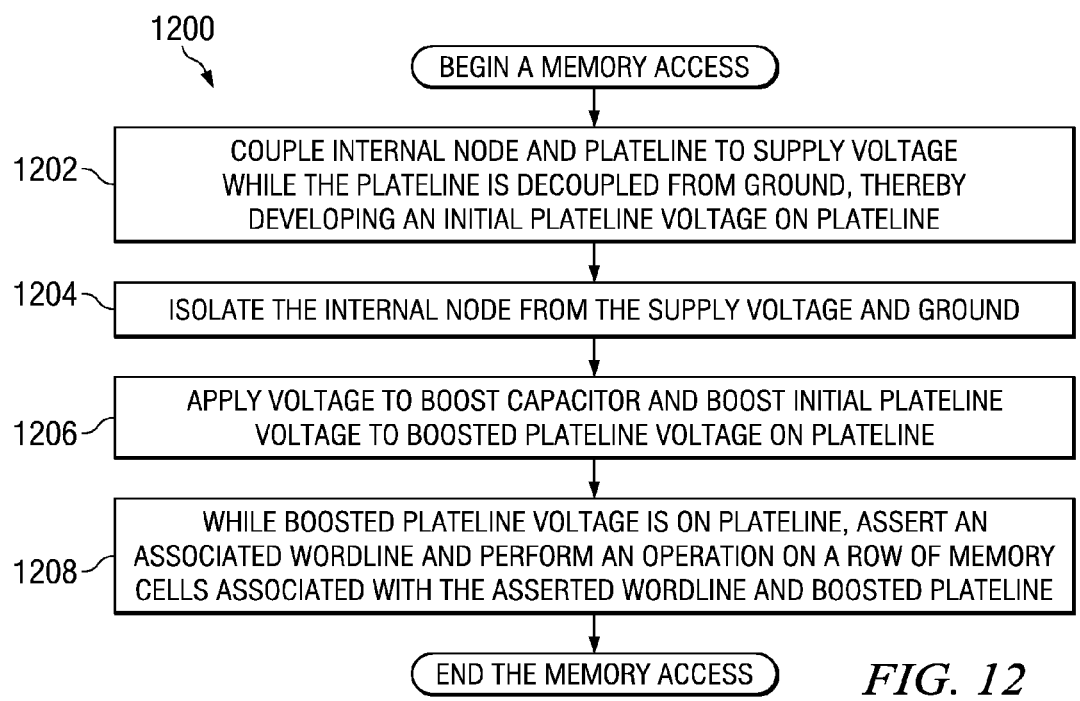
FIG. 12 is another flow diagram illustrating a method of accessing a memory cell using a boosted plateline voltage.

More detailed functionality of this plateline driver 1100 is now discussed with reference to FIGS. 12-13. As shown in FIG. 12, a somewhat general method 1200 begins at 1202 when the plateline PL is coupled to the internal node 1118 and the internal node is coupled to the supply voltage, VDD, while the plateline PL is decoupled from the ground node, thereby developing an initial plateline voltage on the plateline. At 1206, the internal node is isolated from the supply voltage while the PL is isolated from the ground node. At 1208, BOOST is applied to the boost capacitor 1114 and generates a boosted plateline voltage on the internal node 1118 and the plateline PL. At 1210, while the boosted plateline voltage is on the platelines, a wordline associated with the boosted plateline could be asserted to access a row of memory cells and suitable operation performed on the accessed cells to read and or program data values.

Figure 13:
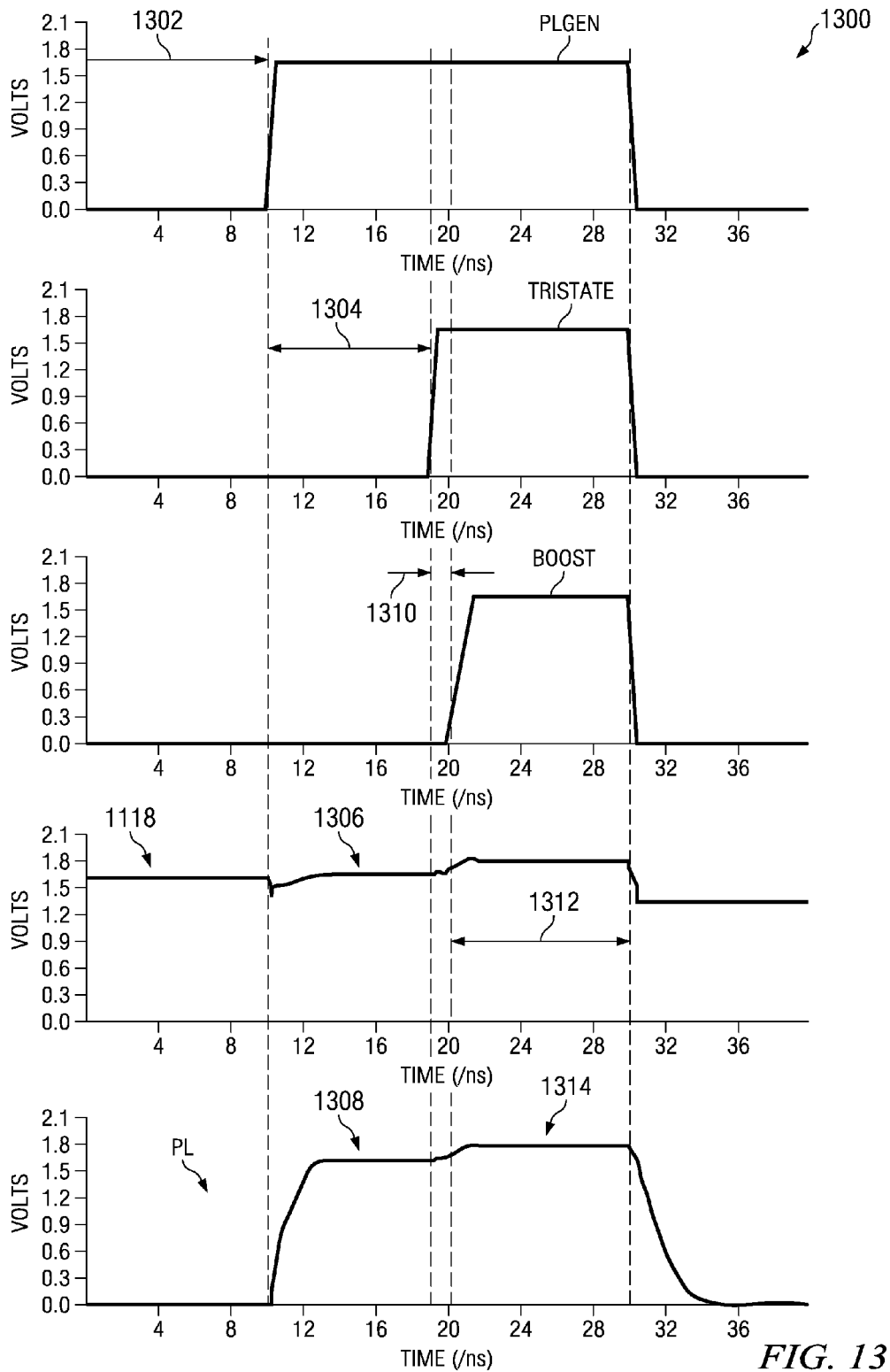
FIG. 13 is a group of waveforms illustrating a method of accessing a memory cell using a boosted plateline voltage consistent with FIG. 11's embodiment.

Referring now to FIG. 13, one can see more detailed waveforms 1300 that are discussed in the context of FIG. 11's plateline driver 1100. During time 1302, TRISTATE, PLGEN, and BOOST are all low, causing the PMOS transistors 1110 and 1116 to be off and causing NMOS transistor 1112 to be on. Therefore, the plateline PL is pulled to ground at this time. The internal node 1118 acquires intermediate voltage depending upon the transistor 1110 and 1116 sizes and various leakage and bias conditions.

During time 1302, PLGEN has transitioned to a high-voltage, thereby turning on PMOS drive transistor 1110 in addition to PMOS transistor 1116. Thus, an initial voltage during the time 1306 is developed on the internal node 1118, where the initial voltage is equal to the supply voltage VDD minus a voltage drop over the PMOS transistor 1116. Further, an initial plateline voltage 1308 is developed on the plateline PL, where the initial plateline voltage 1308 is equal to the supply voltage minus a voltage drop over the PMOS transistor 1116 minus another voltage drop over the PMOS drive transistor 1110.

During time 1310, TRISTATE has transitioned to a high voltage, turning PMOS transistor 1116 off, thereby decoupling PL from VDD and ground, and still leaving PL coupled to the charged capacitor 1114 and to the internal node 1118.

During time 1312, BOOST is driven to a high voltage, causing the capacitor 1114 to "dump" charge onto the plateline PL and boosting the initial plateline voltage 1308 to a boosted plateline voltage 1314.

Also during time 1312, while the boosted plateline voltage 1314 is on the platelines, a wordline associated with the boosted plateline could be asserted to access a row of memory cells and suitable operation performed on the accessed cells to read and or program data Values. In some embodiments, the wordline could be asserted before the plateline voltage is developed.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A ferroelectric memory device, comprising:
    a power supply that provides a supply voltage $V_{DD}$;
    a memory array comprising one or more ferroelectric memory cells that are arranged in a number of plateline groups;
    a plateline driver configured to receive the supply voltage, develop an initial plateline voltage based on the supply voltage, boost the initial plateline voltage above the supply voltage, and provide the boosted plateline voltage along a plateline associated with a predetermined plateline group.

2. The ferroelectric memory device of claim 1, where the plateline driver comprises:
    a capacitor coupled to the plateline, where in the capacitor is configured to selectively discharge as a function of a boost signal, thereby boosting the initial plateline voltage above the supply voltage.

3. The ferroelectric memory device of claim 2, where the capacitor comprises a ferroelectric capacitor.

4. The ferroelectric memory device of claim 3, where the ferroelectric capacitor is part of a non-active edge cell in the memory array.

5. The ferroelectric memory device of claim 1, where the boosted plateline voltage is approximately equal to the supply voltage plus a threshold voltage of a driver transistor.

6. The ferroelectric memory device of claim 1, where the plateline driver comprises:
    at least one capacitor coupled to an internal node of the plateline driver, wherein the capacitor is configured to selectively discharge to boost an initial voltage on the internal node.

7. The ferroelectric memory device of claim 6, where the internal node is configured to be selectively coupled to the plateline to provide the boosted plateline voltage.

8. The ferroelectric memory device of claim 7, where the capacitor comprises an integer number of ferroelectric capacitors within the memory array.

9. A ferroelectric memory device, comprising:
    a memory array comprising one or more ferroelectric memory cells that are arranged in a number of segments, where a segment includes at least some of the ferroelectric memory cells which are arranged in at least two plateline groups;
    a power supply that provides a supply voltage $V_{DD}$;
    a set of plateline drivers associated with the segment; where an individual plateline driver is configured to receive the supply voltage, develop an initial plateline voltage based on the supply voltage, boost the initial plateline voltage above the supply voltage, and provide the boosted plateline voltage along a plateline associated with an individual plateline group within the segment.

10. The ferroelectric memory device of claim 9, where the individual plateline driver further comprises:
    an internal node on which an initial voltage is developed based on the supply voltage;
    a transistor configured to selectively couple the internal node with the initial voltage to the plateline, thereby developing the initial plateline voltage; and
    at least one capacitor coupled to the plateline and configured to selectively discharge, thereby boosting the initial plateline voltage to the boosted plateline voltage.

11. The ferroelectric memory device of claim 10, where the transistor is common to individual plateline drivers within the set of plateline drivers.

12. The ferroelectric memory device of claim 10, where the at least one capacitor is configured to selectively discharge as a function of a boost signal.

13. The ferroelectric memory device of claim 9, where the set of plateline drivers comprises:
    at least one capacitor coupled to the plateline and configured to selectively discharge to boost the plateline voltage above the supply voltage.

14. The ferroelectric memory device of claim 9, where the memory cells are arranged in a 1T1C configuration.

15. The ferroelectric memory device of claim 9, where the memory cells are arranged in a 2T2C configuration.

16. A method of writing a data value to a ferroelectric memory cell, comprising:
    using a supply voltage to develop an initial plateline voltage on a plateline associated with a ferroelectric memory cell;
    isolating the plateline from the supply voltage;
    while the plateline is isolated from the supply voltage, boosting the initial plateline voltage to develop a boosted plateline voltage on the plateline;
    while the boosted plateline voltage is on the plateline, applying a wordline voltage and a bitline voltage to the ferroelectric memory cell to write the data value to the ferroelectric memory cell.

17. The method of claim 16, further comprising:
    coupling an internal node of a plateline driver to the supply voltage to develop the initial plateline voltage.

18. The method of claim 16 wherein at least one capacitor is coupled to the plateline with a transistor in between the plateline and the capacitor;
    the at least one capacitor configured to selectively discharge, thereby boosting the initial plateline voltage to the boosted plateline.

19. The method of claim 16, where the boosted plateline voltage is at least approximately 5% larger than the initial plateline voltage.

20. The method of claim 16, where the boosted plateline voltage is at least approximately 10% larger than the supply voltage.

* * * * *